(12) United States Patent
Asano

(10) Patent No.: US 7,786,784 B2
(45) Date of Patent: Aug. 31, 2010

(54) VARIABLE DELAY CIRCUIT, VARIABLE DELAY DEVICE, AND VCO CIRCUIT

(75) Inventor: Shigetaka Asano, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 10 days.

(21) Appl. No.: 12/042,776

(22) Filed: Mar. 5, 2008

(65) Prior Publication Data

US 2008/0224747 A1 Sep. 18, 2008

(30) Foreign Application Priority Data

Mar. 14, 2007 (JP) ............................. 2007-065724

(51) Int. Cl.
*H03H 11/26* (2006.01)
(52) U.S. Cl. .................. 327/276; 327/277; 327/278; 327/280

(58) Field of Classification Search ................. 327/276, 327/277, 278, 280
See application file for complete search history.

(56) References Cited

U.S. PATENT DOCUMENTS

| 5,434,525 | A * | 7/1995 | Leonowich | 327/278 |
| 7,002,420 | B2 * | 2/2006 | Ngo | 331/57 |

FOREIGN PATENT DOCUMENTS

| JP | 04-172811 A | 6/1992 |
| JP | 06-061810 A | 3/1994 |
| JP | 10-242817 A | 9/1998 |

* cited by examiner

*Primary Examiner*—Kenneth B. Wells
(74) *Attorney, Agent, or Firm*—Arent Fox LLP

(57) ABSTRACT

Herein disclosed is a variable delay circuit, including a first delay portion that delays an input signal; an output portion; and a variable impedance portion provided coupled between the first delay portion and an the output portion.

11 Claims, 14 Drawing Sheets

Related Art

VARIABLE DELAY CIRCUIT, VARIABLE DELAY DEVICE, AND VCO CIRCUIT

CROSS-REFERENCE TO RELATED APPLICATIONS

This application is based upon and claims the benefit of priority from the prior Japanese Patent Application No. 2007-065724 filed on Mar. 14, 2007, the entire contents of which are incorporated herein by reference.

BACKGROUND OF THE INVENTION

1. Field of the Invention

It is related to a variable delay circuit.

2. Description of Related Art

Japanese Laid-open Patent Publication No. 10-242817 discloses a delay circuit that controls the delay time of a rising edge and a falling edge by using two transfer gates. FIG. 1 shows the circuit diagram of the pulse width variable circuit disclosed in Japanese Laid-open Patent Publication No. 10-242817.

When the level of an input pulse signal IN changes from "L" to "H," NMOS126 is turned on and a current path I2 becomes conductive. When the level of input pulse signal IN changes from "H" to "L," NMOS122 is turned on and a current path I1 becomes conductive. The input pulse signal IN is propagated to a buffer 131 via the current path I1 or the current path I2. The signal propagation delay time in each current path I1 and I2 is set respectively depending on the resistance values of transfer gates 121 and 125 that change respectively according to control signals S11 and S12 and the capacity of a capacitor 124.

In addition, the technology that relates to a delay circuit is disclosed in Japanese Laid-open Patent Publication No. 4-172811 and Japanese Laid-open Patent Publication No. 6-61810.

SUMMARY

According to one embodiment, a variable delay circuit is provided, which includes a first delay portion that delays an input signal; an output portion; and a variable impedance portion provided coupled between the first delay portion and an the output portion.

DESCRIPTION OF THE PREFERRED EMBODIMENTS

Figure 1:
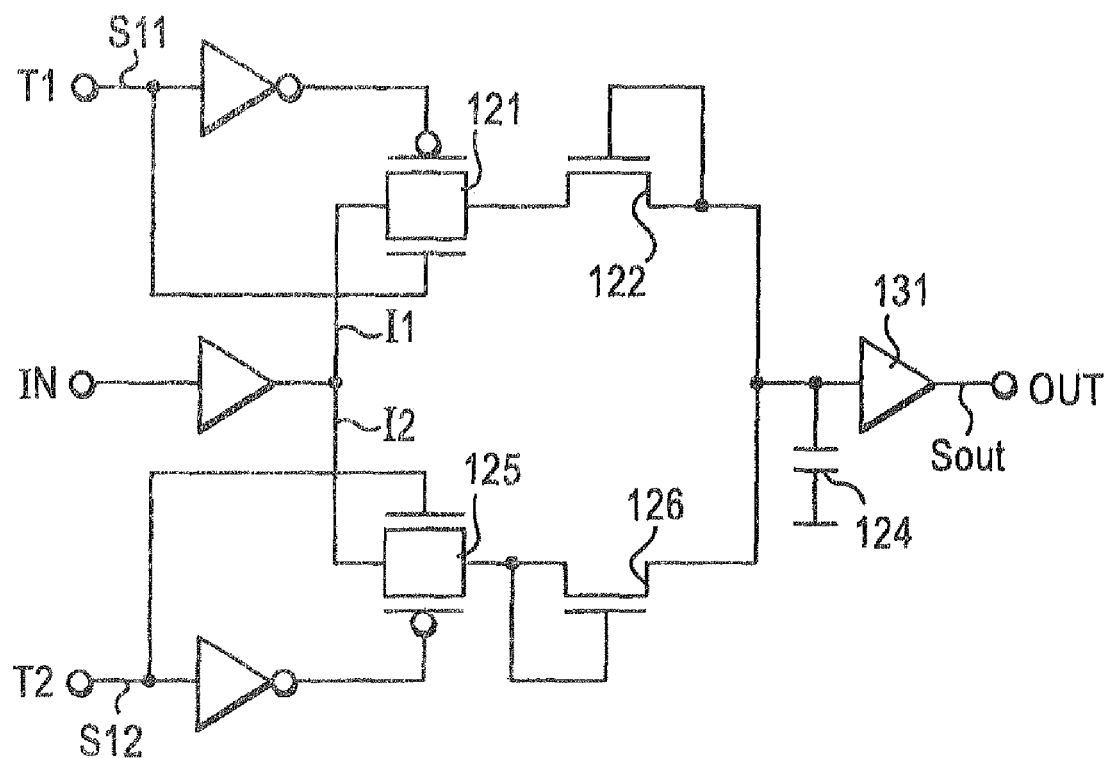
FIG. 1 shows a conventional pulse width variable circuit.

Referring to FIG. 1, when a delay time is adjusted only at the transfer gate, even if it is biased as the impedance of the transfer gate is minimized, the limitation is generated in the length of the delay time of the transfer gate. As a result, a delay time that is smaller than the delay time of the transfer gate might not be controlled.

Figure 2:
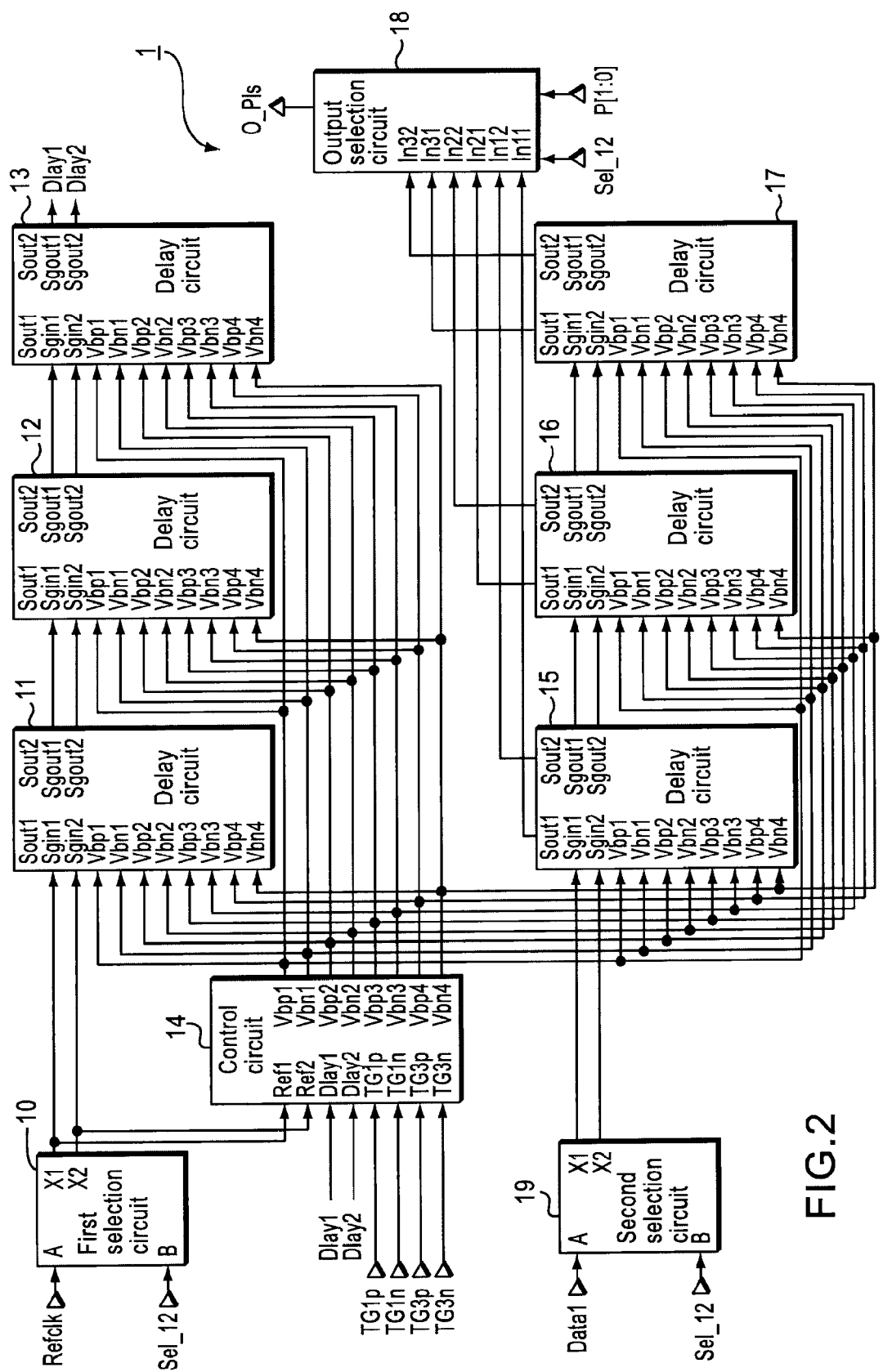
FIG. 2 shows a circuit diagram of a first embodiment.

FIG. 2 is a circuit diagram of the first embodiment. A delay device 1 includes a delay locked loop (DLL) portion locked at a predetermined frequency. When the DLL portion is locked, a bias voltage of the delay device 1 is similar to the bias voltage of delay circuits 15 to 17, which are connected in series in the same number of stages as the DLL portion.

Delay device 1 includes a first selection circuit 10 that switches a bandwidth of the oscillation frequency of the DLL portion, delay circuits 11 to 13 that configure the delay portion of the DLL portion, a control circuit 14 that supplies bias voltage to each of the delay circuits, the delay circuits 15 to 17 that are connected in series in the same number of stages as the DLL portion, an output selection circuit 18 that selects a delay time from the delay circuits 15 to 17, and the second selection circuit 19 that switches between a path to an input terminal Sgin1 and a path to an input terminal Sgin2 of the delay circuit 15 to input an input data signal Data 1.

The DLL portion and the delay circuits 15 to 17 are connected by an output terminal Sgout1 and an input terminal Sgin1, and by an output terminal Sgout2 and an input terminal Sgin2. The path of the output terminal Sgout1 and the input terminal Sgin1, and the path of the output terminal Sgout2 and the input terminal Sgin2 are configured separately. When oscillating the DLL portion for a short period of time, the output terminal Sgout1 and the input terminal Sgin1 are used. When oscillating the DLL portion for a long period of time, the output terminal Sgout2 and the input terminal Sgin2 are used.

In the delay device 1, when input data signal Data1 of the second selection circuit 19 is input, an output signal O_Pls, which takes EOR between a delay input terminal In11 or In12 selected by a select signal Sel_12 of the output selection circuit 18 and any one of delay input terminals In21, In22, In31, and In32, depending on a select signal Sel_12 and an output select signal P[1:0], is output.

Figure 3:
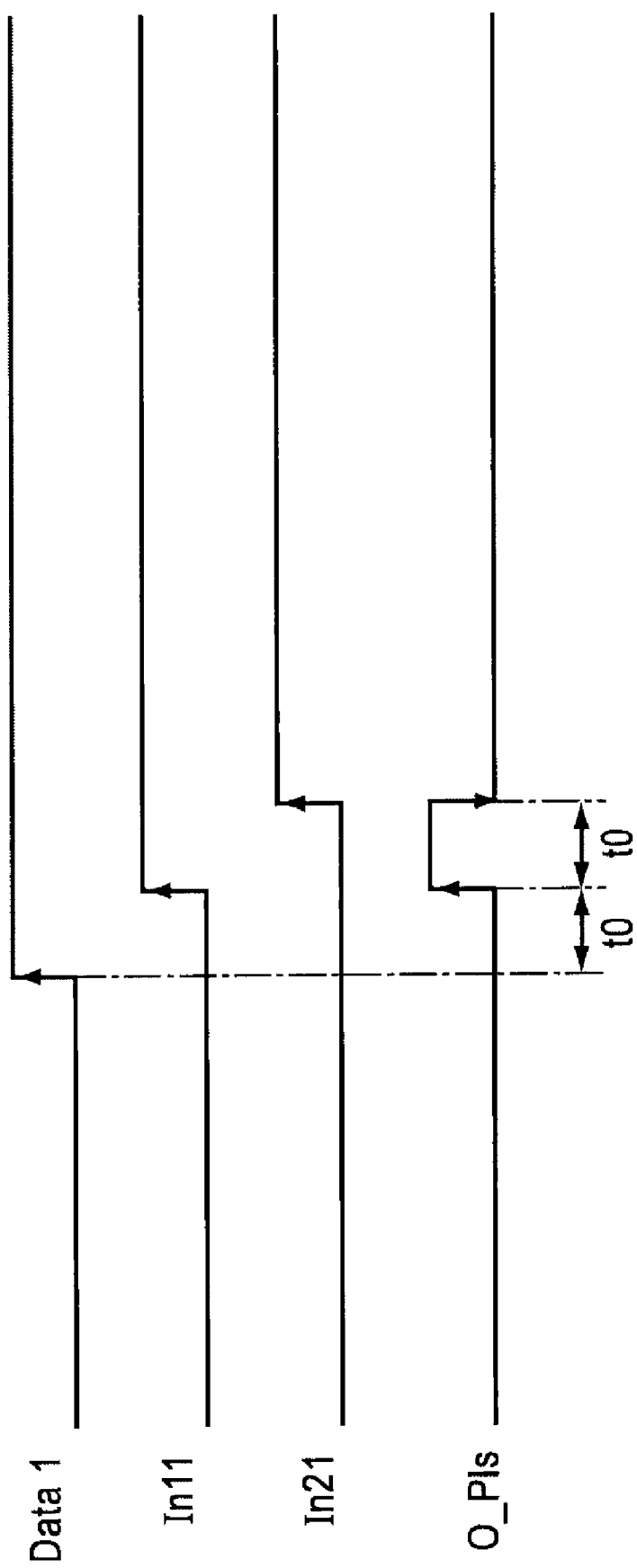
FIG. 3 shows a timing chart of the first embodiment.

FIG. 3 shows a timing chart in the case where the select signal Sel_12 is in a low level and the delay input terminal In11 is selected and the output select signal P[1:0] is 01 and the delay input terminal In21 is selected. The output signal O_Pls is generated as shown in FIG. 3.

If the input data signal Data1 is input, a signal to the delay input terminal In11 transitions from the low level to the high level after delay time t0. At that time, EOR processing with the high level signal of the delay input terminal In11 and the low level signal of the delay input terminal In21 is performed. As a result, the output signal O_Pls transitions from the low level to the high level. In addition, the delay input terminal In21 transitions from the low level to the high level after delay time t0. At that time, EOR processing of the high level signal of the delay input terminal In11 and the high level signal of the delay input terminal In21 is performed. As a result, the output signal O_Pls transitions from the high level to the low level. Thus, after the delay time t0, since the input data signal Data1 was input, a pulse with the width of the delay time t0 is output. Delay time t0 is the period of a reference clock Refclk here.

The reference clock Refclk is input to the input terminal A of the first selection circuit 10. In addition, the select signal Sel_12 is input to the selection terminal B of the first selection circuit 10. Depending on the signal level of the select signal Sel_12, the reference clock Refclk or the low level is output to the output signals X1 and X2. When the select signal Sel_12 is in a high level, the reference clock Refclk is output to the output terminal X1, and the low level is output to the output terminal X2. On the other hand, when the select signal Sel_12 is in a low level, the low level is output to the output terminal X1 and the reference clock Refclk is output to the output terminal X2. The input terminal Sgin1 of the delay circuit 11 is connected to the output terminal X1 of the first selection circuit 10. The input terminal Sgin2 of the delay circuit 11 is connected to the output terminal X2.

Figure 4:
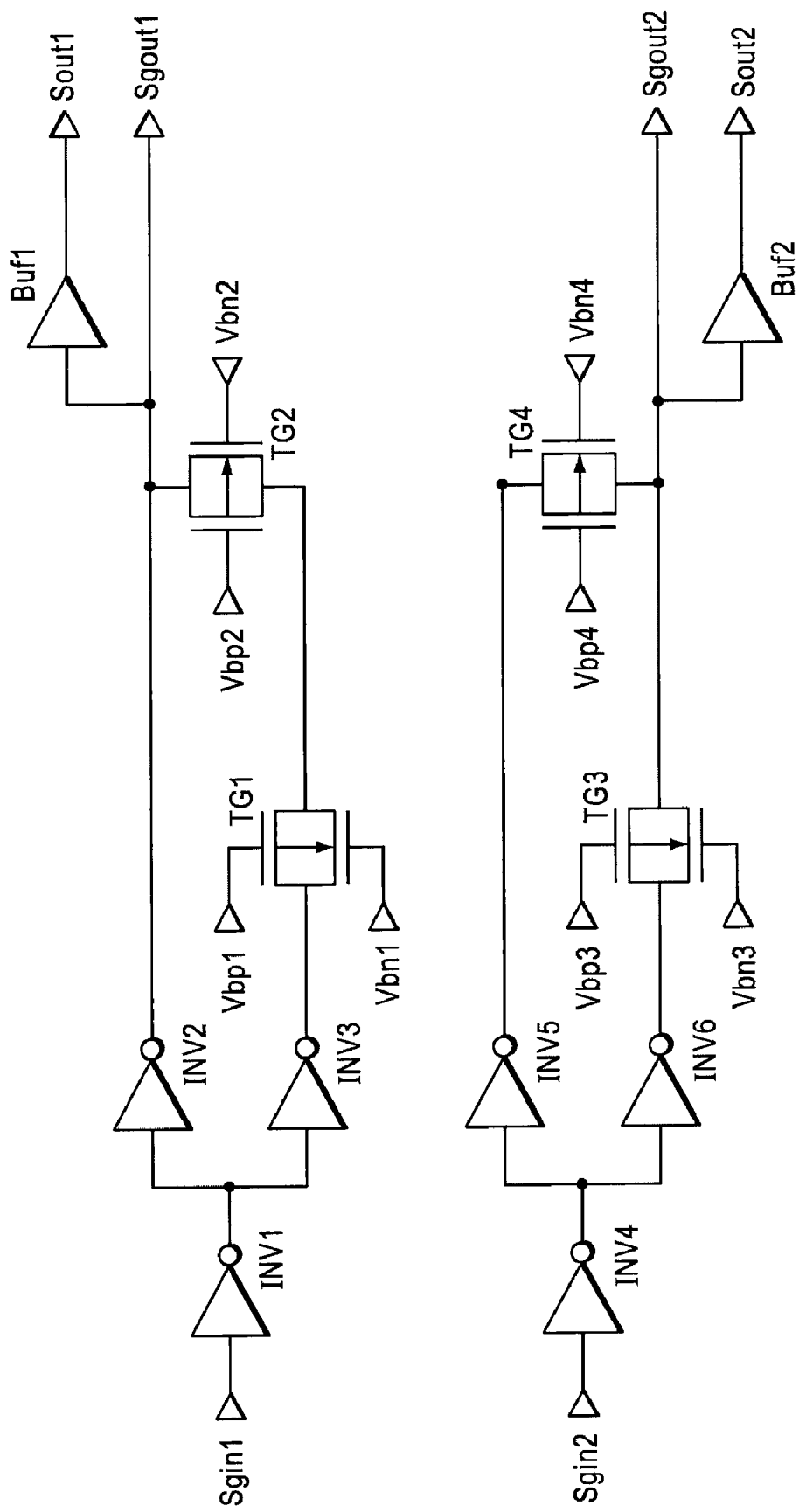
FIG. 4 shows a delay circuit.

FIG. 4 shows the configuration of the delay circuits 11 to 13 and 15 to 17. The delay circuits 11 to 13 and 15 to 17 comprise inverters INV1 to INV6, transfer gates TG1 to TG4, and buffers Buf1 and Buf2.

The input of an inverter INV1 is connected with the input terminal Sgin1. The output of the inverter INV1 is connected with the input of an inverter INV2 and an inverter INV3. The output of the inverter INV2 is connected with one end of a transfer gate TG2, the input of a buffer Buf1 and the output terminal Sgout1. The output of the inverter INV3 is connected with one side of the transfer gate TG1. The other side of TG1 is connected with one side of the transfer gate TG2.

The input of an inverter INV4 is connected with the input terminal Sgin2. The output of the inverter INV4 is connected with the input of an inverter INV5 and an inverter INV6. The output of the inverter INV5 is connected with one side of a transfer gate TG4. The output of the inverter INV6 is connected with one side of a transfer gate TG3. The other side of the transfer gate TG3 is connected with the other side of the transfer gate TG4, the input of a buffer Buf2 and the output terminal Sgout2.

In the above connection, if the impedances of the transfer gates TG2 and TG4 are changed by changing the bias voltage to the transfer gates TG2 and TG4, the delay time is changed.

Figure 5:
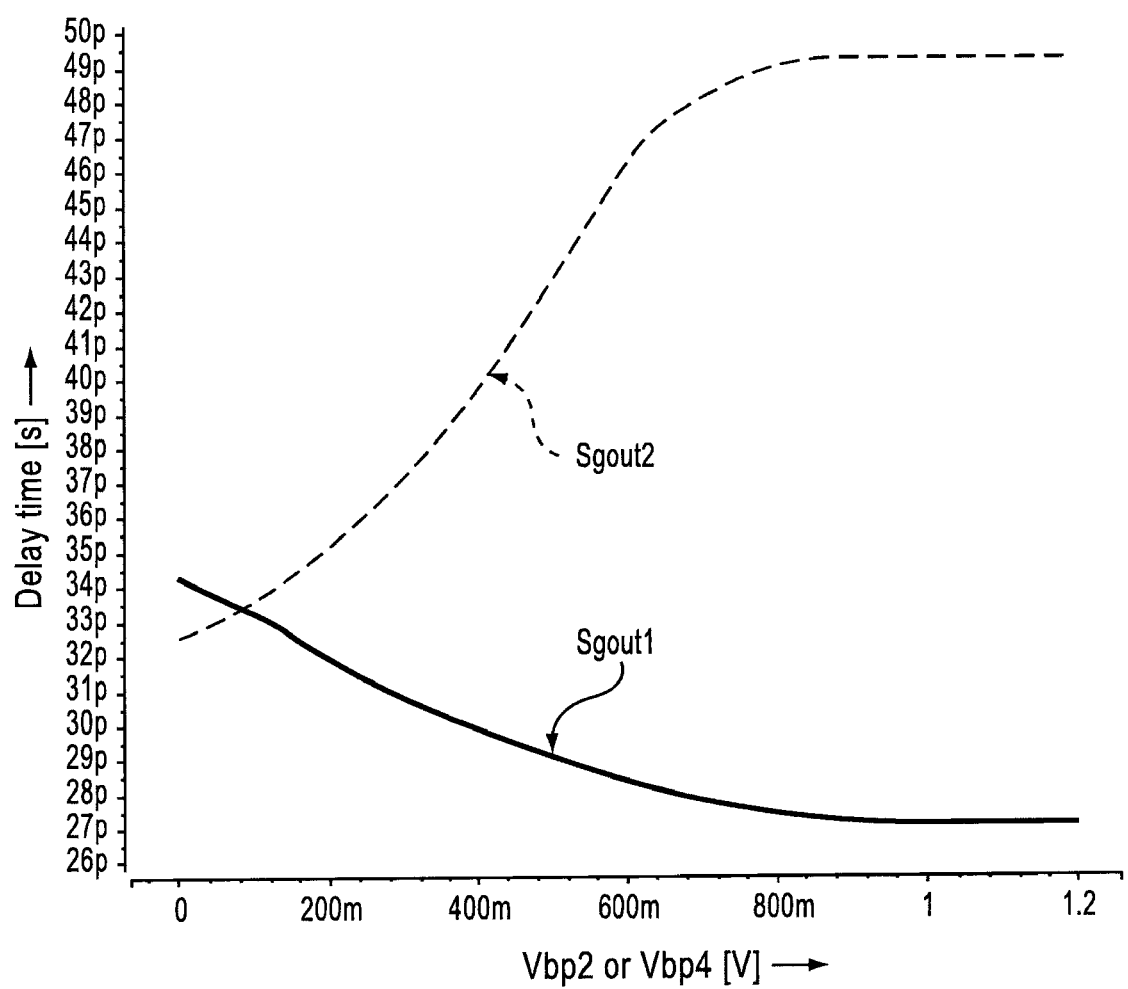
FIG. 5 shows a relationship between a bias voltage and a delay time.

FIG. 5 is a volt-time curve that shows the delay time of the delay circuits 11 to 13 and 15 to 17 to the bias voltage of the transfer gate TG2 or TG4. The horizontal axis shows the bias voltage Vbp2 or Vbp4. The bias voltage Vbn2 is replaced by the value of 1.2V-bias voltage Vbp2, and the bias Vbn4 is replaced by the value of 1.2V-bias voltage Vbp4. The impedance of the transfer gate TG2 or TG4 becomes higher impedance toward the right of the horizontal axis. The vertical axis shows the delay time of the signal that is output from the output terminal Sgout1 connected with the transfer gate TG2 or TG4, or the delay time of the signal that is output from the output terminal Sgout2.

At this time, if the impedance of the transfer gate TG2 is increased by changing in the direction where the bias voltage Vbp2 of the transfer gate TG2 becomes higher, the synthetic amount of the delay time of the signal that is output from the transfer gate TG1 becomes smaller. Thus, the delay time of the signal that is output from the output terminal Sgout1 becomes smaller. As a result, a delay time can be generated that is smaller than the delay time of the signal output from the transfer gate TG1.

On the other hand, if the impedance of the transfer gate TG4 is increased by changing in the direction where the bias voltage Vbp4 of the transfer gate TG4 becomes higher, the synthetic amount of the delay time between the signal output from the inverter INV5 and the delay time of the transfer gate TG3 becomes smaller. As a result, the delay time of the signal that is output from the output terminal Sgout2 becomes larger.

In addition, in the delay circuits 11 to 13 and 15 to 17 of the first embodiment, inverters INV1 to INV6 include the buffers. As a result, the change in the impedance of transfer gates TG2 and TG4 can be prevented from influencing the circuit of the former stages.

The output terminals Sgout1 and Sgout2 of the delay circuit 11 in FIG. 2 are connected with the input terminals Sgin1 and Sgin2 of the delay circuit 12 respectively. In addition, the output terminals Sgout1 and Sgout2 of the delay circuit 12 in FIG. 2 are connected with the input terminals Sgin1 and Sgin2 of the delay circuit 13 respectively. Delay signals Dlay1 and Dlay2 output from the output terminal 1 of the delay circuit 13 in FIG. 2 are input to delay terminals Dlay1 and Dlay2 of the control circuit 14.

In addition, bias voltage supply terminals Vbp1, Vbn1, Vbp2, Vbn2, Vbp3, Vbn3, Vbp4, and Vbn4 to which each bias voltage of the delay circuits 11 to 13 is supplied are connected with the corresponding terminals of the control circuit 14.

Figure 6:
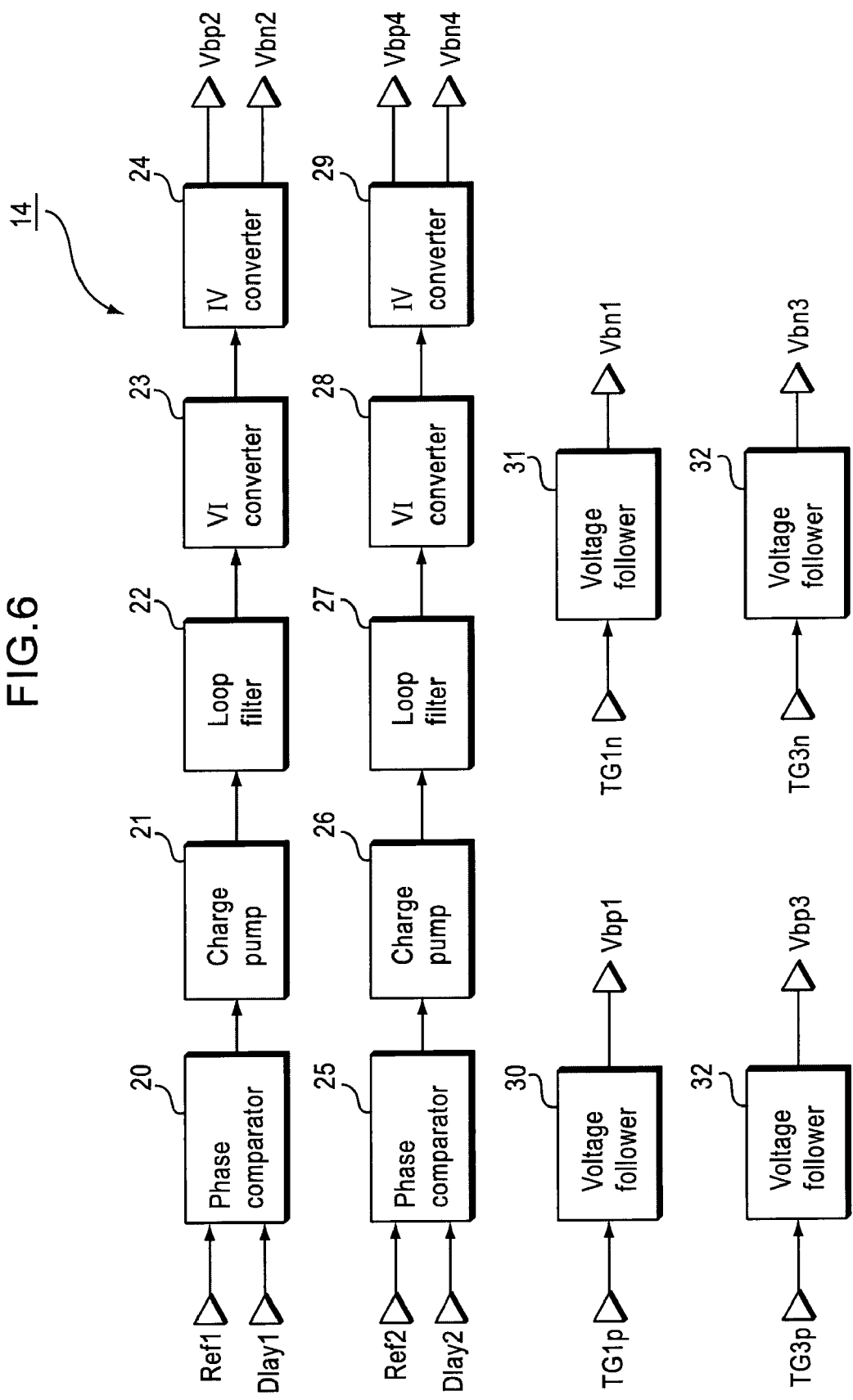
FIG. 6 shows a control circuit.

FIG. 6 shows the control circuit 14. The control circuit 14 comprises phase comparators 20 and 25, charge pumps 21 and 26, loop filters 22 and 27, VI converters 23 and 28, and IV converters 24 and 29 and voltage followers 30 to 32.

The phase comparator 20, the charge pump 21, the loop filter 22, the VI converter 23 and the IV converter 24 together with the input terminal Sgin1 of the delay circuits 11 to 13 and the input/output on the output terminal Sgout1 side comprise the DLL portion.

In addition, the phase comparator 25, the charge pump 26, the loop filter 27, the VI converter 28 and the IV converter 29 together with the input terminal Sgin2 of the delay circuits 11 to 13 and the input/output on the output terminal Sgout2 side comprise the DLL portion.

The voltage follower 30 buffers the bias voltage input to the bias voltage input terminal TG1p and outputs the bias voltage to the bias voltage supply terminal Vbp1. The voltage follower 31 buffers the bias voltage input to the bias voltage input terminal TG1n and outputs the bias voltage to the bias voltage supply terminal Vbn1. The voltage follower 32 buffers the bias voltage input to the bias voltage input terminal TG3p and outputs the bias voltage to the bias voltage supply terminal Vbp3. The voltage follower 33 buffers the bias voltage input to the bias voltage input terminal TG3n and outputs the bias voltage to the bias voltage supply terminal. Vbn3.

Signals from the output terminals Sout1 and Sout2 of the delay circuits 15 to 17 are input to the output selection circuit 18. The output selection circuit 18 outputs the pulse signals from the output signal O_Pls according to the select signal Sel_12 and the output select signal P[1:0]. The select signal Sel_12 is a signal that selects the signals from the output terminal Sout1 or the signals from the output terminal Sout2 of the delay circuits 15 to 17. In addition, the output select signal P [1:0] is a 2-bit signal that determines which output terminal Sout1 or Sout2 of the delay circuits 15 to 17 is selected.

The input data signal Data1 is input to the input terminal A of the second selection circuit 19, and the select signal Sel_12 is input to a selection terminal B of the second selection circuit 19. The second selection circuit 19 outputs the input data signal Data1 to the output terminals X1 and X2 according to the signal level of the select signal Sel_12. When the select signal Sel_12 is in a high level, the second selection circuit 19 outputs the input data signal Data1 to the output terminal X1, and outputs the low level to the output terminal X2. On the other hand, when the select signal Sel_12 is in a low level, the second selection circuit 19 outputs the low level to the output terminal X1, and outputs the input data signal Data1 to the output terminal X2. The input terminal Sgin1 of the delay circuit 11 is connected with the output terminal X1 of the second selection circuit 19 and the input terminal Sgin2 of the delay circuit 15 is connected with the output terminal X2 respectively.

The delay circuits 15 to 17 are connected in series in the same number of stages as the delay circuits 11 to 13 that comprise the DLL portion. The voltage supplied to each of the bias voltage supply terminals Vbp1, Vbn1, Vbp2, Vbn2, Vbp3, Vbn3, Vbp4, and Vbn4 of the delay circuit is set similarly to the voltage supplied to the delay circuits 11 to 13 that comprise the DLL portion. As a result, accurate delay time can be obtained in units that the period of the predetermined frequency when the DLL portion is locked is divided by the number of stages of the delay circuits 15 to 17.

The minimum value of the delay time from the input terminal Sgin1 to the output terminal Sgout1 becomes the sum of the following three values.

(1) Delay time of the inverter INV1.

(2) Delay time of the inverter INV2.

(3) Synthesized delay time when the impedance of the transfer gate TG1 is a minimum value and the impedance of the transfer gate TG2 is a maximum value.

And the maximum value of delay time from the input terminal Sgin1 to the output terminal Sgout1 becomes the sum of the following three values.

(1) Delay time of the inverter INV1.

(2) Delay time of the inverter INV2.

(3) Synthesized delay time when impedance of the transfer gate TG1 is a maximum value, and impedance of the transfer gate TG2 is a minimum value.

From the input terminal Sgin1 to the output terminal Sgout1 is assumed to be the path of the delay circuits 11 to 13 and 15 to 17. By the path, per stage of the delay circuit, the DLL portion can be oscillated with the delay time in the range from the minimum value of the above delay time to the maximum value of the above delay time.

The minimum value of the delay time from the input terminal Sgin2 to the output terminal Sgout2 becomes the sum of the following three values.

(1) Delay time of the inverter INV4.

(2) Delay time of the inverter INV6.

(3) Synthesized delay time when the impedance of the transfer gates TG3 and TG4 is a minimum value.

And the maximum value of the delay time at this time becomes the sum of the following three values.

(1) Delay time of the inverter INV4.

(2) Delay time of the inverter INV6.

(3) Synthesized delay time when the impedance of the transfer gates TG3 and TG4 is a maximum value.

From the input terminal Sgin2 to the output terminal Sgout2 is assumed to be the path of the delay circuits 11 to 13 and 15 to 17. By the path, per stage of the delay circuit, the DLL portion can be oscillated with the delay time in the range from the minimum value of the above delay time to the maximum value of the above delay time.

In addition, it is possible to switch between the path that passes the output terminal Sgout1 and the input terminal Sgin1 and the path that passes the output terminal Sgout2 and the input terminal Sgin2 by the select signal Sel_12. As a result, the DLL portion can be oscillated with the delay time in the range from a small amount of delay time to a large amount of delay time.

In addition, it is possible to select a signal from the output terminal Sout1 or the output terminal Sout2 from the delay circuits 15 to 17 by the output select signal P[1:0]. As a result, a pulse that has the pulse width of ⅓, ⅔ and 1 of the oscillation period of the DLL portion can be accurately taken out to O_Pls.

The first embodiment comprises a variable impedance portion TG2, TG4 installed between a first delay portion TG1, TG3 and an input signal. The variable impedance portion TG2, TG4 comes to function as variable resistor that lies between the input signal and the first delay portion TG1, TG3, and the output from the first delay portion TG1, TG3 is synthesized with the input signal. As a result, the first embodiment can generate a shorter delay time than the delay time of the first delay portion.

In addition, in the first embodiment, the bias voltage to the delay portion of the variable delay circuit or to the variable impedance portion when the DLL portion is locked is input to the delay portion or the variable impedance portion of each variable delay circuit. As a result, as bias voltage in a variable delay generation portion, bias voltage that generates the delay time that the period of the predetermined frequency of the variable delay circuit in the DLL portion locked with predetermined frequency is divided by the number of stages of the variable delay generation portion is input. Thus, delay time is accurately generated in units of delay time that the period of predetermined frequency is divided by the number of stages of the variable delay generation portion.

The first embodiment includes three stages in the DLL portion, however it can also include other number of stages, for example, 20 stages or 32 stages.

Figure 7:
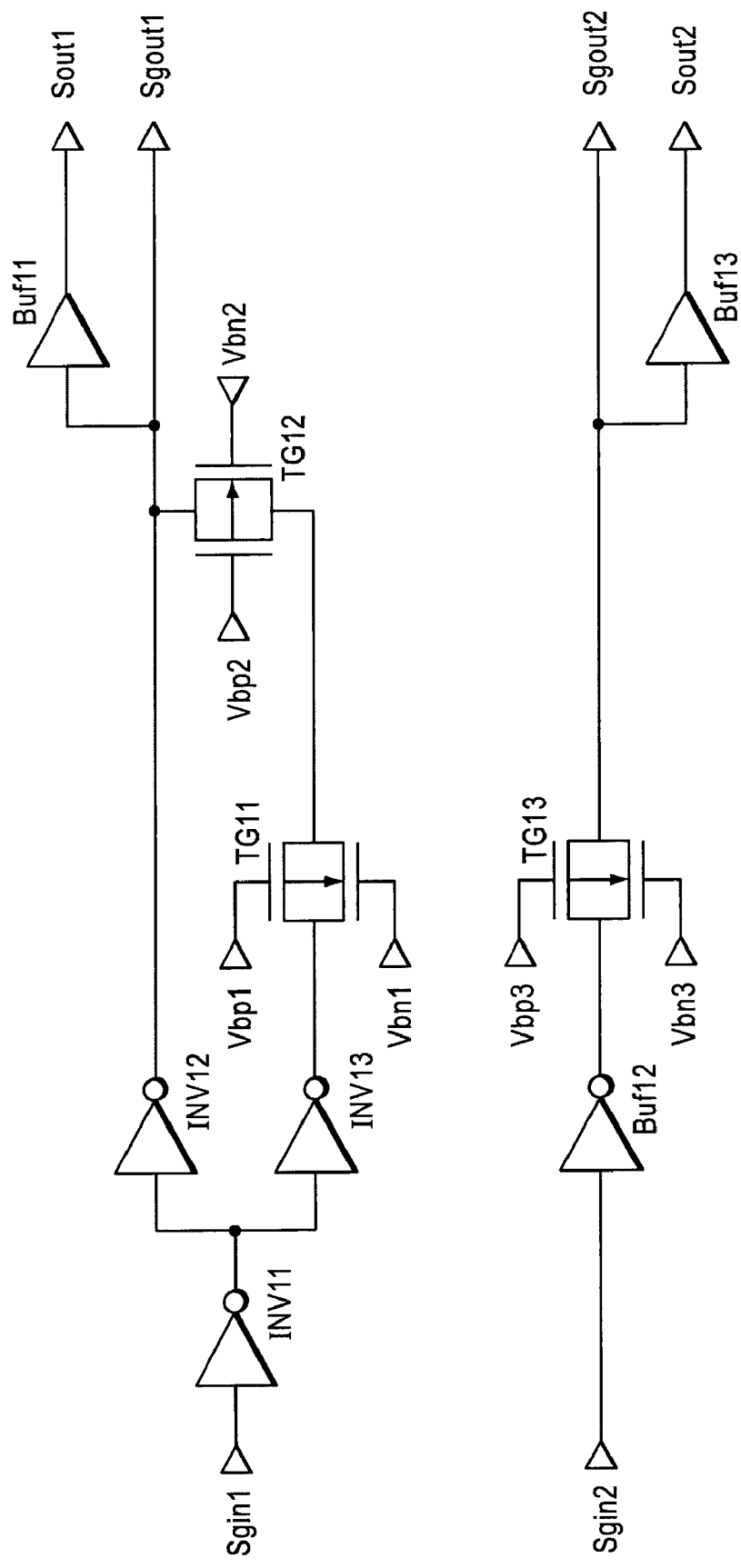
FIG. 7 shows a circuit diagram of a second embodiment.

FIG. 7 shows the circuit diagram of the second embodiment. The delay circuits 11 to 13 and 15 to 17 comprise the inverters INV11 to 13, the transfer gates TG11 to TG13, and buffers Buf11 to Buf13.

Difference between the delay circuits 11 to 13 and 15 to 17 of the second embodiment and the delay circuits of the first embodiment is that the delay element of the path from the input terminal Sgin2 to the output terminal Sgout2 comprises only the transfer gate TG13 in the second embodiment.

This configuration can be used when the delay time of the path from the input terminal Sgin2 to the output terminal Sgout2 can be large.

The configuration of the second embodiment is simpler than the delay circuit of the first embodiment.

Figure 8:
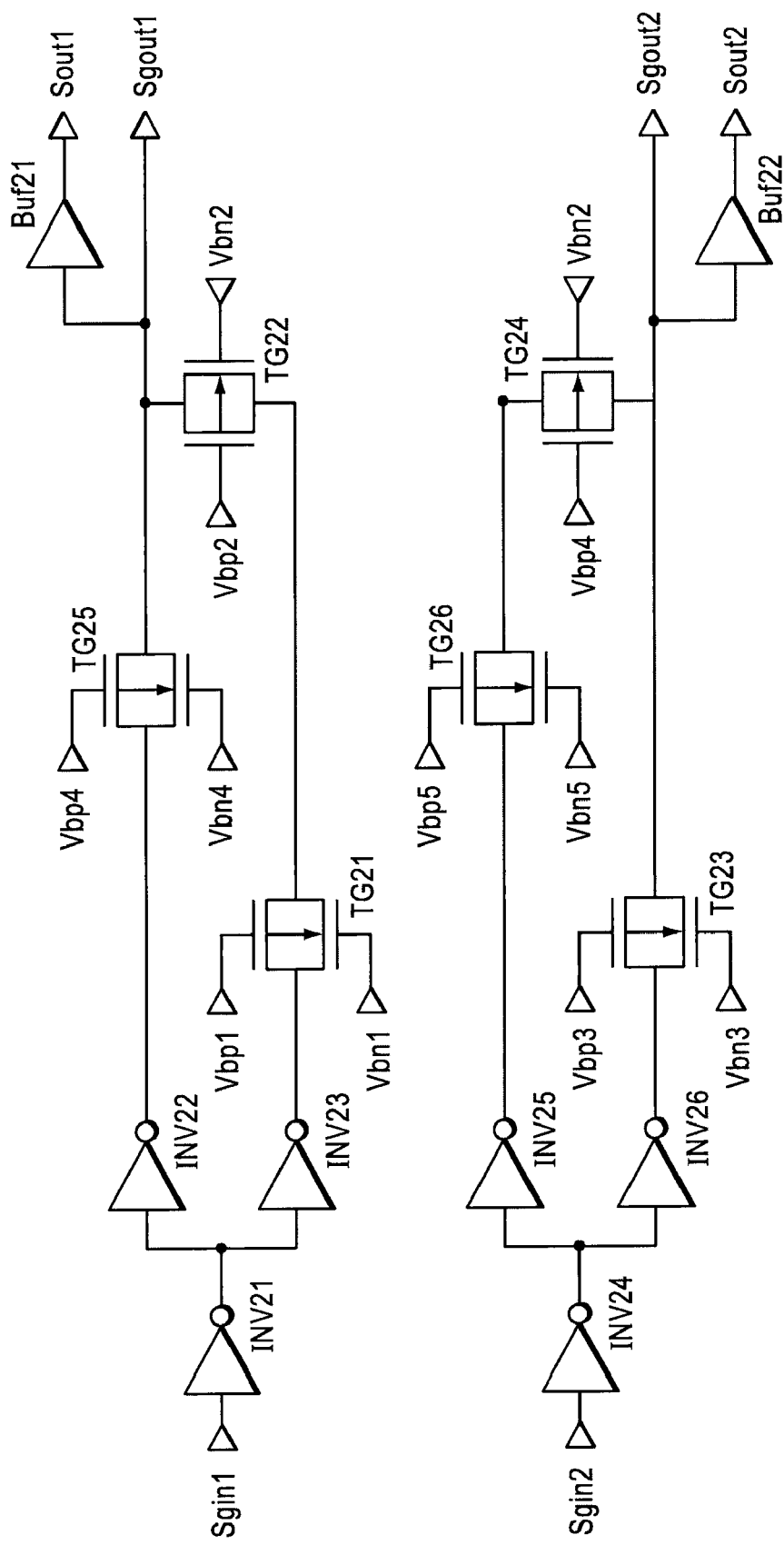
FIG. 8 shows a circuit diagram of a third embodiment.

FIG. 8 shows the circuit diagram of the third embodiment. The delay circuits 11 to 13 and 15 to 17 comprise the inverters INV21 to INV26, transfer gates TG21 to TG26, and buffers Buf21 and Buf22.

Difference between the delay circuits 11 to 13 and 15 to 17 of the third embodiment and the delay circuits 11 to 13 and 15 to 17 of the first embodiment is that the transfer gate TG25 is installed in the path from the inverter INV22 to the transfer gate TG22 in the third embodiment. In addition, difference between the delay circuits 11 to 13 and 15 to 17 of the third embodiment and the delay circuits 11 to 13 and 15 to 17 of the first embodiment is that the transfer gate TG26 is installed in the path from the inverter INV25 to the transfer gate TG24 in the third embodiment.

The bias voltage of the bias voltage terminals Vbp4 and Vbn4 of the transfer gate TG25 is set as the delay time of the transfer gate TG25, and becomes smaller than the delay time of the transfer gate TG21. In addition, the bias voltage of the bias voltage terminals Vbp5 and Vbn5 of the transfer gate TG26 is set as the delay time of the transfer gate TG26, and becomes smaller than the delay time of the transfer gate TG23.

By these settings, as the delay time from the input terminal Sgin1 to the output terminal Sgout1, the delay time within the range where the delay time of the transfer gate TG25 and the delay time of the transfer gate TG21 are synthesized, can be obtained.

Figure 9:
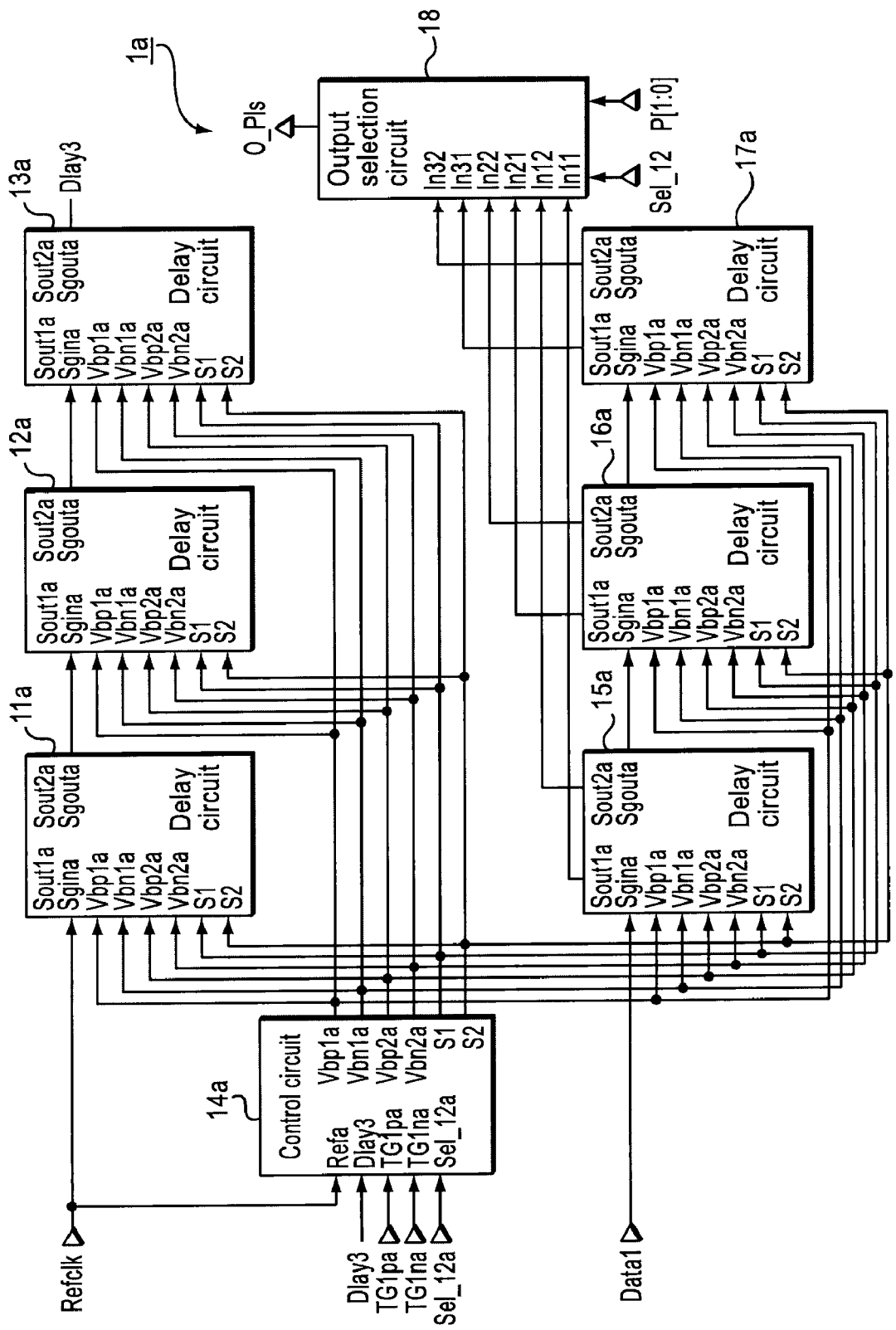
FIG. 9 shows a circuit diagram of a fourth embodiment.

FIG. 9 shows a circuit diagram of the fourth embodiment. As for the delay device 1a of the fourth embodiment, the terminal of the delay circuit is simplified. As for the delay device 1 of the first embodiment, there are two connections that are from the output pin Sgout1, Sgout2 to Sgin1, Sgin2. As for the delay device 1a of the fourth embodiment, connections from the output terminal Sgouta to the input terminal Sgina is decreased to one connection. In addition, 8 connections of the bias voltage supply terminals Vbp1, Vbn1, Vbp2, Vbn2, Vbp3, Vbn3, Vbp4, and Vbn4 in the delay device 1 of the first embodiment, are decreased to 4 connections of bias voltage supply terminals Vbp1a, Vbn1a, Vbp2a and Vbn2a in the delay device 1a of the fourth embodiment. Instead of decreasing these connections, the selection terminals S1 and S2 to input/output selection signals to each delay circuit are added to the delay device 1a of the fourth embodiment.

Figure 10:
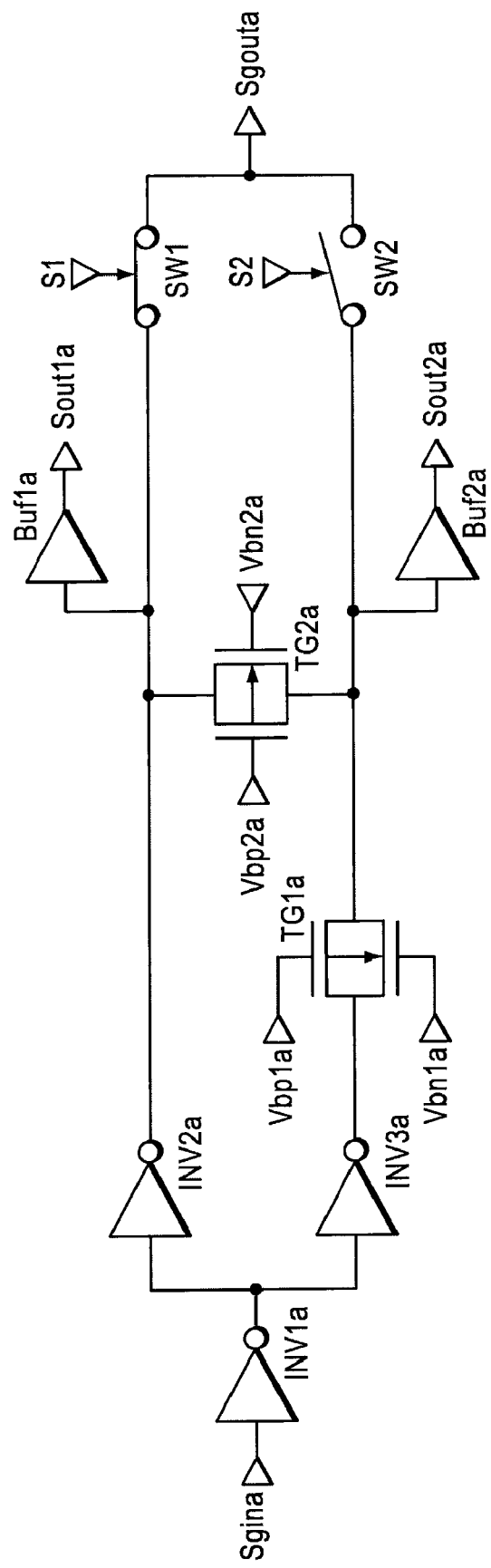
FIG. 10 shows a delay circuit.

FIG. 10 shows the configuration of the delay circuits 11a to 13a and 15a to 17a. The delay circuits 11a to 13a and 15a to 17a include the inverters INV1a to INV3a, the transfer gates TG1a and TG2a, the buffers Buf1a and Buf2a, and the switches SW1 and SW2. The switches SW1 and SW2 include an element, such as MEMS element, whose delay time is smaller than the delay time of the transfer gate.

Similarly to the delay circuits 11 to 13 and 15 to 17 of the first embodiment, each of the one side of the transfer gates TG1a and TG2a is connected with the input path from the input terminal Sgina, and the other sides of the transfer gates TG1a and TG2a are connected commonly. In addition, the difference between the delay circuits of the fourth embodiment and the delay circuits 11 to 13 and 15 to 17 of the first embodiment is that those of the fourth embodiments comprise the switches SW1 and SW2 controlled by the selection terminals S1 and S2. When the signal of the selection terminal S1 is in a high level, the switch SW1 is conducting. When the signal of the selection terminal S2 is in a high level, the switch SW2 is conducting. The selection signals of selection terminals S1 and S2 are controlled exclusively, and they are controlled so that only one of the switches SW1 and SW2 is conducting.

Figure 11:
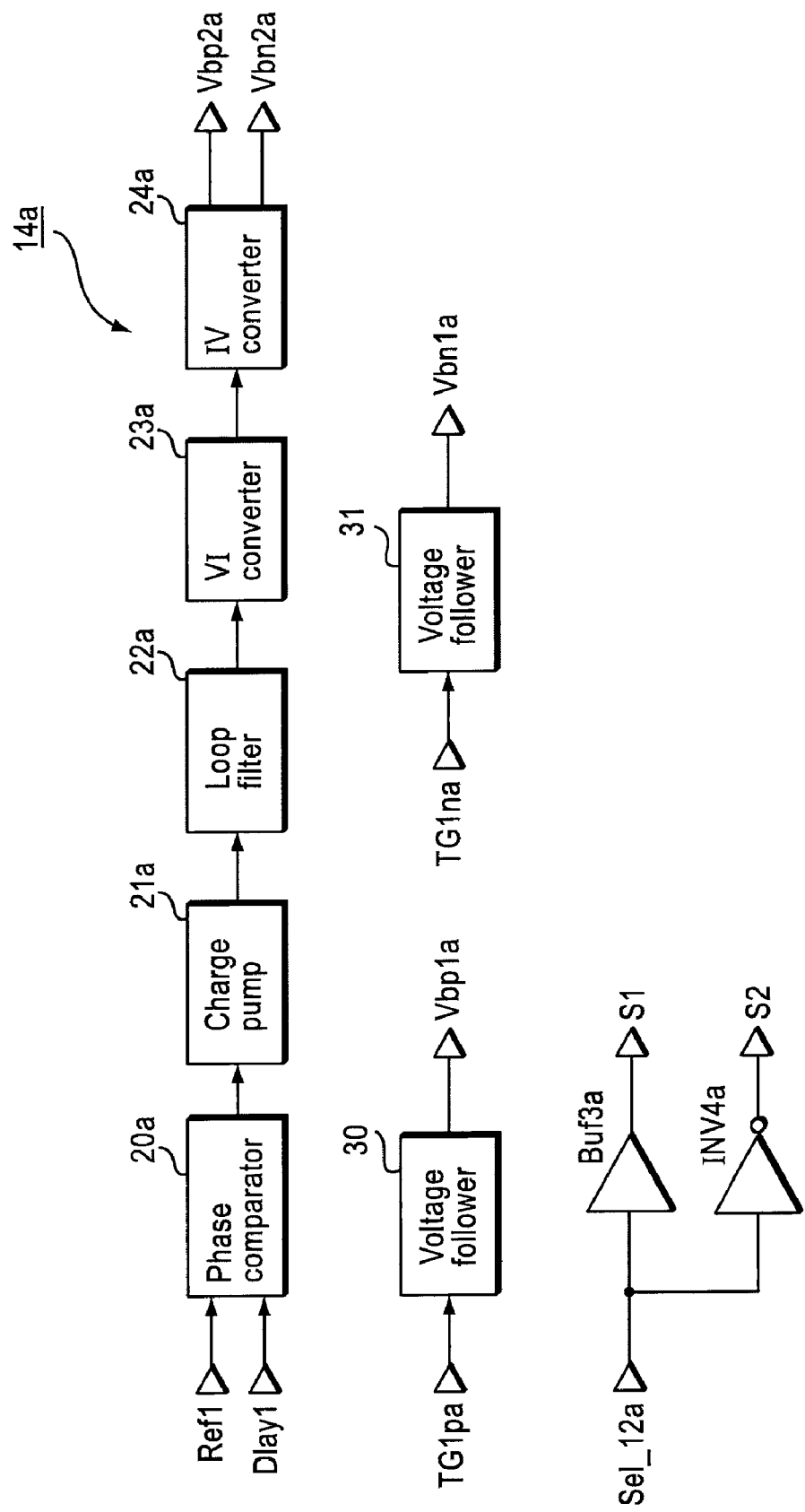
FIG. 11 shows a control circuit.

FIG. 11 shows the configuration of the control circuit 14a. The control circuit 14a includes a phase comparator 20a, a charge pump 21a, a loop filter 22a, a VI converter 23a, a IV converter 24a, a voltage follower 30a, a voltage follower 31a, a buffer Buf3a, and an inverter INV4a.

The connection surroundings of the delay circuits 11a to 13a of FIG. 9 are explained below. A reference clock Refclk is input to the input terminal Sgina of the delay circuit 11a. The output terminal Sgouta of the delay circuit 11a is connected with the input terminal Sgina of the delay circuit 12a. The output terminal Sgouta of the delay circuit 12a is connected with the input terminal Sgina of the delay circuit 13a. The output terminal Sgouta of the delay circuit 13a is input to the delay terminal Dlay3 of the control circuit 14a as delay signal Dlay3, and fed back. The DLL portion includes the delay circuits 11a to 13a, the phase comparator 20a, the charge pump 21a, the loop filter 22a, the VI converter 23a, and the IV converter 24a.

The voltage follower 30a buffers the bias voltage input to the bias input voltage terminal TG1pa and outputs the bias voltage to the bias voltage terminal Vbp1a. The voltage follower 31a buffers the bias voltage input to the bias input voltage terminal TG1na and outputs the bias voltage to the bias voltage terminal Vbn1a.

The buffer Buf3a and the inverter INV4a output signals with a exclusive level mutually to the selection terminals S1 and S2 based on the select signal Sel_12a to be input. When the select signal Sel_12a is in a high level, a high level signal is output to the selection terminal S1 and a low level signal is output to the selection terminal S2. On the other hand, when the selection signal Sel_12a is in a low level, a low level signal is output to the selection terminal S1 and a high level signal is output to the selection terminal S2.

In addition, the minimum value of delay time of the delay circuit 15, when the switch SW1 is conducting and the switch SW2 is not conducting, is the sum of the following three values.

(1) Delay time of the inverter INV1a.

(2) Delay time of the inverter INV2a.

(3) The synthesized delay time when the impedance of the transfer gate TG1a is the minimum value and the impedance of the transfer gate TG2a is the maximum value.

In addition, the maximum value of delay time of the delay circuit 15, when the switch SW1 is conducting and the switch SW2 is not conducting, becomes the sum of the following three values.

(1) Delay time of the inverter INV1a.

(2) Delay time of the inverter INV2a.

(3) The synthesized delay time when the impedance of the transfer gate TG1a is a maximum value and the impedance of the transfer gate TG2a is a minimum value.

As a result, the delay device 1a of the fourth embodiment can oscillate the DLL portion with the delay time in the range from the minimum value of the above delay time to the maximum value of the above delay time per stage of the delay circuit because the switch SW1 is conducting and the switch SW2 is not conducting.

On the other hand, when the switch SW1 is not conducting and the switch SW2 is conducting, the minimum value of delay time of the delay circuit 15 becomes the sum of the following three values.

(1) Delay time of the inverter INV1a.

(2) Delay time of the inverter INV3a.

(3) The synthesized delay time when the transfer gates TG1a and TG2a are minimum values.

When the switch SW1 is not conducting and the switch SW2 is conducting, the maximum value of delay time of the delay circuit 15 becomes the sum of the following three values.

(1) Delay time of the inverter INV1a.

(2) Delay time of the inverter INV3a.

(3) The synthesized delay time when the impedances of the transfer gates TG1a and TG2a are maximum values.

The delay circuits 16 and 17 are similar to the delay circuit 15.

As a result, because the switch SW is not conducting and the switch SW2 is conducting, the delay device 1a of the fourth embodiment can oscillate the DLL portion with the delay time in the range from the minimum value of the above delay time to the maximum value of the above delay time per stage of the delay circuit.

In addition, unlike the delay device 1 of the first embodiment, in the delay device 1a of the second embodiment, the connection between delay circuits is simplified and the configuration of each delay circuit 11a to 13a and 15a to 17a can be simplified.

Though the DLL portion of the fourth embodiment includes three stages, it can include another number of stages, such as 20 stages or 32 stages.

Figure 12:
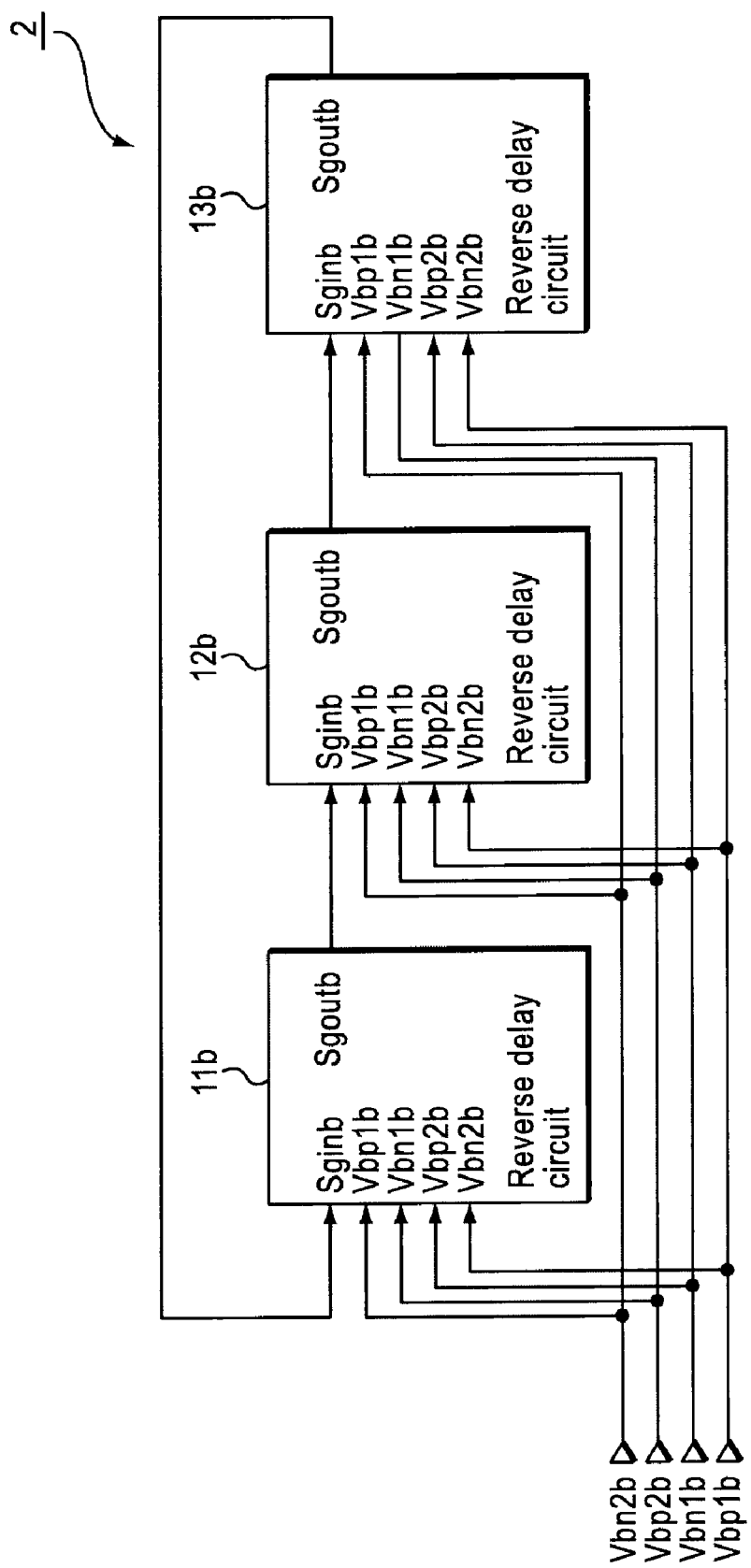
FIG. 12 is a circuit diagram of a fifth embodiment.

FIG. 12 is a circuit diagram of the fifth embodiment. A VCO circuit 2 comprises reverse delay circuits 11b to 13b.

An output terminal Sgoutb of the reverse delay circuit 11b is connected with an input terminal Sginb of the reverse delay circuit 12b. The output terminal Sgoutb of the reverse delay circuit 12b is connected with an input terminal Sginb of the reverse delay circuit 13b. The output terminal Sgoutb of the reverse delay circuit 13b is connected with an input terminal Sginb of the reverse delay circuit 11b.

In addition, bias voltage terminals Vbp1b, Vbn1b, Vbp2b, and Vbn2b are commonly input to the reverse delay circuits 11b to 13b to which bias voltage is supplied.

Figure 13:
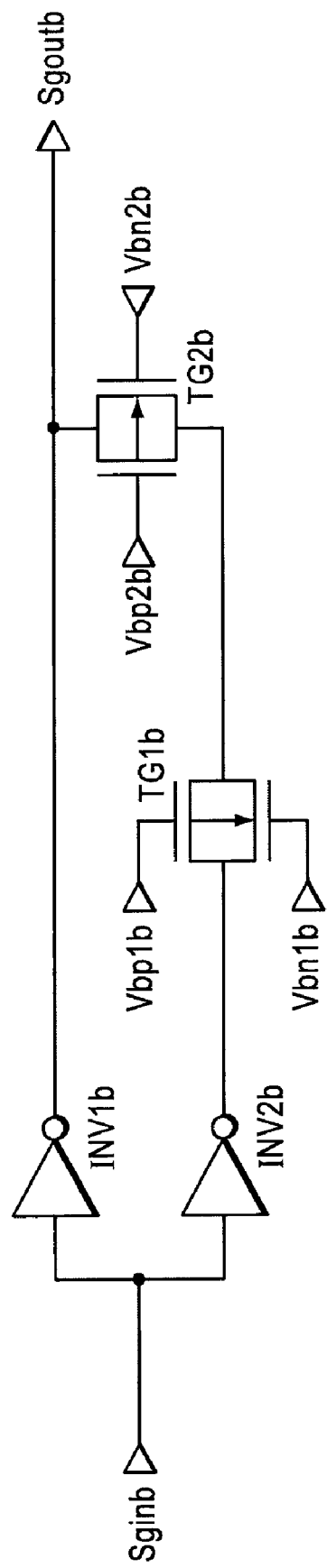
FIG. 13 shows a reverse delay circuit.

FIG. 13 shows the reverse delay circuits 11b to 13b. The reverse delay circuits 11b to 13b comprise the inverters INV1b and INV2b and the transfer gates TG1b and TG2b. The output terminal Sgoutb outputs the signal that the signal level of the input terminal Sginb is reversed.

The minimum value of delay time of the reverse delay circuit 11b becomes the sum of the following two values.

(1) Delay time of the inverter INV1.

(2) The synthesized delay time when the impedance of the transfer gate TG1b is the minimum value and the impedance of the transfer gate TG2b is the maximum value.

On the other hand, the maximum value of delay time of the reverse delay circuit 11b becomes the sum of the following two values.

(1) Delay time of the inverter INV1b.

(2) The synthesized delay time when the impedance of the transfer gate TG1b is the maximum value and the impedance of the transfer gate TG2b is the minimum value.

By changing the bias voltage of the bias voltage terminals Vbp1b, Vbn1b, Vbp2b and Vbn2b of the transfer gates TG1b and TG2b, the delay time of the path from the input terminal Sginb to the output terminal Sgoutb can be adjusted in the range from the minimum value of the above delay time to the maximum value of the above delay time.

From the above-mentioned configuration, as for the VCO circuit 2 in the fifth embodiment, the reverse delay circuits 11b to 13b function as oscillation circuits. In addition, the VCO circuit 2 of the fifth embodiment functions as the VCO circuit whose oscillation frequency changes by changing the bias voltage terminals Vbp1b, Vbn1b, Vbp2b and Vbn2b.

The VCO circuit 2 of the fifth embodiment performs fine control to the synthetic value of delay time with the impedance of the transfer gate TG1b according to the change of the impedance of the transfer gate TG2b from the minimum value to the maximum value. Thus, the VCO circuit can accurately oscillate fine oscillation frequency with a delay time smaller than that of the delay portion by the variable impedance portion.

The fifth embodiment includes three stages of oscillation in the VCO circuit. However, the fifth embodiment can also include the other number of odd stages, for example, five stages and seven stages.

Figure 14:
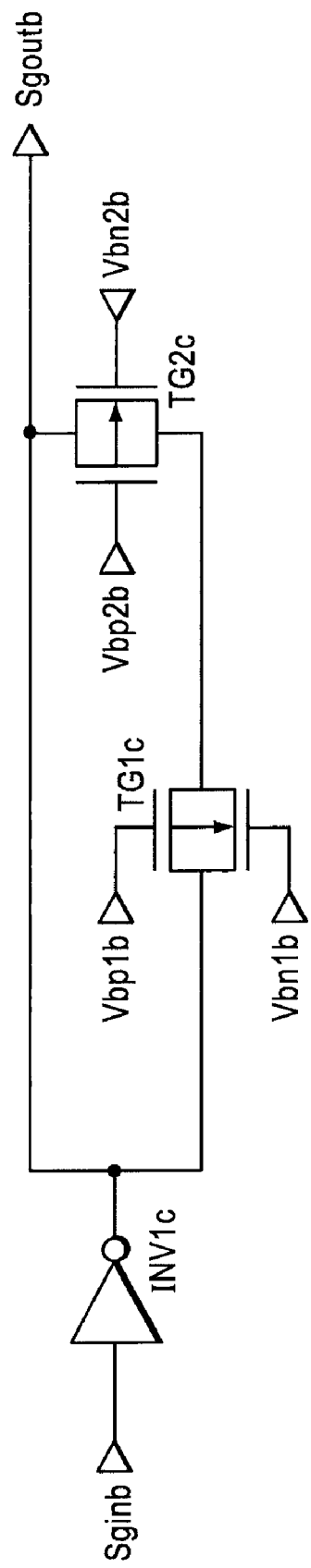
FIG. 14 shows a reverse delay circuit.

FIG. 14 shows the circuit diagram of the fifth embodiment. The circuit in FIG. 14 drives the transfer gates TG1c and transfer gate TG2c with one inverter INV1c by connecting the input side terminal and the output terminal Sgoutb of the transfer gate TG1c. The circuit in FIG. 14 is different from the circuit in FIG. 13 on this point. The connection of the input side terminal and the output terminal Sgoutb of the transfer gate TG1c provides the reverse delay circuits 11b to 13b and has fewer inverters.

In addition, the embodiment is not to be considered limited to the above-mentioned embodiments, it is obvious that various improvements and changes may be made without departing from the scope.

For example, in the first to fifth embodiments, transfer gates are used as elements to delay input signals. However, in the first to fifth embodiments, delay elements that are not transfer gates but inverters are combined and can be used.

In addition, in the first to fifth embodiments, though transfer gates are used as elements that synthesize input signals and delayed signals, a circuit that can change impedance can be used. For example, in the first to fifth embodiments, a circuit that connects resistive elements in series or in parallel and changes impedance by taking out signals from the center tap of the resistive element can be also used. In addition, in the first to fifth embodiments, a circuit that can change impedance in the direction of outputting Sgoutx (x is 1, 2, 1a, 2a and b) can be used. As a result, the first to fifth embodiments can combine an element that unilaterally changes impedance, such as diode, and use the combined element.

Further, the reverse delay circuit in the fifth embodiment (FIG. 14) uses a circuit in which the input of the inverter INV1c is connected with the input terminal Sginb. However, in the fifth embodiment, a circuit in which the output of the inverter INV1c is connected with the output terminal Sgoutb can be also used.

For purposes of explanation, in the above description, numerous specific details are set forth in order to provide a thorough understanding of the invention. It will be apparent, however, to one skilled in the art that the invention can be practiced without these specific details. In other instances, well-known structures and devices are shown in block diagram form in order to avoid obscuring the invention.

While the invention has been described in conjunction with the specific embodiments thereof, it is evident that many alternatives, modifications, and variations will be apparent to those skilled in the art. Accordingly, embodiments of the invention, as set forth herein, are intended to be illustrative, not limiting. There are changes that may be made without departing from the spirit and scope of the invention.

What is claimed is:

1. A variable delay device, comprising:
   a delay locked loop (DLL) portion that includes a plurality of first variable delay circuits locked to a predetermined frequency; and
   a variable delay generation portion that includes a plurality of second variable delay circuits,
   wherein each of the plurality of first variable delay circuits and each of the plurality of second variable delay circuits comprise:
   a first delay portion that delays an input signal;
   an output portion; and
   a variable impedance portion provided between the first delay portion and the output portion.

2. The variable delay device of claim 1, wherein a bias voltage that is supplied to the first variable delay circuit is substantially the same as a bias voltage that is supplied to the second variable delay circuit.

3. The variable delay device of claim 1, wherein the number of stages of the plurality of first variable delay circuits is the same as the number of the plurality of second variable circuits.

4. The variable delay device of claim 1, wherein each of the first variable delay circuits includes a first selection circuit that switches between a first path and a second path of the input signal.

5. The variable delay device of claim 1, further comprising:
a first path without the first delay portion and a second path via the variable impedance portion, wherein the signal path through the variable delay device can be switched between the first path and the second path.

6. The variable delay device of claim 1, wherein each of the second variable delay circuits includes a first selection circuit that switches a first path and a second path of the output signal.

7. The variable delay device of claim 1, further comprising:
an output selection circuit that outputs a pulse signal based on an output signal from the plurality of second variable circuits.

8. The variable delay device of claim 1, further comprising:
a control circuit that supplies a bias voltage to the plurality of first variable delay circuits and the plurality of second variable delay circuits.

9. The variable delay device of claim 8, wherein the control circuit includes a phase comparator which receives a reference delay signal and a delay signal output from one of the plurality of first variable delay circuits.

10. The variable delay device of claim 4, wherein the plurality of the first variable circuits output a first delay signal varying in a first delay range in the first path and the plurality of the first variable circuits output a second delay signal varying in a second delay range in the second path.

11. The variable delay device of claim 6, wherein the plurality of the second variable circuits output a first delay signal varying in a first delay range in the first path and the plurality of the second variable circuits output a second delay signal varying in a second delay range in the second path.

* * * * *